US009388530B2

(12) United States Patent
Von Drasek et al.

(10) Patent No.: US 9,388,530 B2

(45) Date of Patent: *Jul. 12, 2016

(54) METHOD AND APPARATUS FOR MONITORING AND CONTROLLING THE APPLICATION OF PERFORMANCE ENHANCING MATERIALS TO CREPING CYLINDERSTO IMPROVE PROCESS

(71) Applicant: NALCO COMPANY, Naperville, IL (US)

(72) Inventors: William A. Von Drasek, Oak Forest, IL (US); Rodney H. Banks, Aurora, IL (US); Gary S. Furman, St. Charles, IL (US)

(73) Assignee: NALCO COMPANY, Naperville, IL (US)

(*) Notice: Subject to any disclaimer, the term of this patent is extended or adjusted under 35 U.S.C. 154(b) by 0 days.

This patent is subject to a terminal disclaimer.

(21) Appl. No.: 14/183,510

(22) Filed: Feb. 18, 2014

(65) Prior Publication Data

US 2014/0170302 A1 Jun. 19, 2014

Related U.S. Application Data

(63) Continuation-in-part of application No. 12/246,797, filed on Oct. 7, 2008, now Pat. No. 8,691,323.

(51) Int. Cl.

*C23C 14/54* (2006.01)
*D21F 7/06* (2006.01)
*B31F 1/12* (2006.01)
*B31F 1/14* (2006.01)
*D21F 11/14* (2006.01)
*D21G 9/00* (2006.01)

(52) U.S. Cl.

CPC . *D21F 7/06* (2013.01); *B31F 1/126* (2013.01); *B31F 1/14* (2013.01); *D21F 11/14* (2013.01); *D21G 9/0036* (2013.01); *D21G 9/0045* (2013.01)

(58) Field of Classification Search

CPC .............. B31F 1/126; B31F 1/14; D21F 7/06; D21G 9/0036; D21G 9/0045

USPC ............ 73/73, 74, 149, 150 R; 324/634, 640, 324/643, 689, 693–696; 427/8–10

See application file for complete search history.

(56) References Cited

U.S. PATENT DOCUMENTS

| | | | | | |
|---|---|---|---|---|---|
| 3,774,237 | A * | 11/1973 | Hardway, Jr. | ................. | 324/663 |
| 5,328,565 | A * | 7/1994 | Rasch et al. | .................. | 162/113 |
| 5,355,083 | A * | 10/1994 | George et al. | ................. | 324/229 |
| 2007/0208115 | A1 * | 9/2007 | Grigoriev et al. | ............. | 524/127 |

* cited by examiner

*Primary Examiner* — Alexander Weddle

(74) *Attorney, Agent, or Firm* — Eric D. Babych; Brinks Gilson & Lione

(57) ABSTRACT

The invention provides methods and compositions for monitoring and controlling the thickness of coating on a creping cylinder is disclosed. The methodologies involve a coordinated scheme of apparatuses that function to monitor various aspects of a creping cylinder coating so that the thickness of the coating can be determined.

7 Claims, 12 Drawing Sheets

Bare Metal

Bare Metal

Coated Region

Coated + Bare Spot

Coated + Bare Spot

METHOD AND APPARATUS FOR MONITORING AND CONTROLLING THE APPLICATION OF PERFORMANCE ENHANCING MATERIALS TO CREPING CYLINDERSTO IMPROVE PROCESS

CROSS-REFERENCE TO RELATED APPLICATIONS

This application is a continuation in part of co-pending U.S. patent application Ser. No. 12/246,797 filed on Oct. 7, 2008.

STATEMENT REGARDING FEDERALLY SPONSORED RESEARCH OR DEVELOPMENT

Not Applicable.

BACKGROUND OF THE INVENTION

The invention relates to compositions, methods, and apparatuses for monitoring and controlling a creping cylinder/Yankee dryer coating. The Yankee coating and creping application is arguably the most important, as well as, the most difficult to control unit operation in the tissue making process. For creped tissue products, this step defines the essential properties of absorbency, bulk, strength, and softness of tissue and towel products. Equally important, is that efficiency and runnability of the creping step controls the efficiency and runnability of the tissue machine as a whole.

A common difficulty with the tissue making process is the non-uniformity in characteristics of the coating on the creping cylinder in the cross direction. The coating is composed of adhesives, modifiers, and release agents applied from the spray boom, as well as, fibers pulled from the web or sheet, organic and inorganic material from evaporated process water, and other chemicals added earlier to the wet end of the tissue manufacturing process. Inhomogeneity in the coating characteristics is often related to variations in temperature, moisture, and regional chemical composition across the face of the dryer. The variation is often quite significant and can result in variable sheet adhesion, deposits of different characteristics and/or a lack of material on the cylinder that can result in excess Yankee/creping cylinder and creping bladewear. Degradation of final sheet properties, such as absorbency, bulk, strength, and softness can also result from this variation and/or degradation. As a result of these drawbacks, monitoring and control methodologies for the coating on the creping cylinder surface are therefore desired.

The art described in this section is not intended to constitute an admission that any patent, publication or other information referred to herein is "prior art" with respect to this invention, unless specifically designated as such. In addition, this section should not be construed to mean that a search has been made or that no other pertinent information as defined in 37 CFR §1.56(a) exists.

BRIEF SUMMARY OF THE INVENTION

To satisfy the long-felt but unsolved needs identified above, at least one embodiment of the invention is directed towards a method of monitoring and optionally controlling the application of a coating containing a Performance Enhancing Material (PEM) on a surface of a creping cylinder. the method may comprise: (a) applying a coating to the surface of a creping cylinder; (b) measuring the thickness of the coating on the surface of a creping cylinder by a differential method, wherein said differential method utilizes a plurality of apparatuses that do not physically contact the coating; (c) optionally adjusting the application of said coating in one or more defined zones of said creping cylinder in response to the thickness of said coating so as to provide a uniform thick coating on the surface of the creping cylinder; and (d) optionally applying an additional device(s) to monitor and optionally control other aspects of the coating on a creping cylinder aside from the thickness of the coating.

The present invention may also provide for a method of monitoring and optionally controlling the application of a coating containing a Performance Enhancing Material (PEM) on a surface of a creping cylinder comprising: (a) applying a coating to the surface of a creping cylinder; (b) providing an interferometer probe with a source wavelength that gives adequate transmission through a coating on the creping cylinder surface; (c) applying the interferometer probe to measure the reflected light from a coating air surface and a coating cylinder surface of the creping cylinder to determine the thickness of the coating on the creping cylinder; (d) optionally adjusting the application of said coating in one or more defined zones of said creping cylinder in response to the thickness of said coating so as to provide a uniform thick coating on the surface of the creping cylinder; and (e) optionally applying an additional device(s) to monitor and optionally control other aspects of the coating on a creping cylinder aside from the thickness of the coating.

Additional features and advantages are described herein, and will be apparent from, the following Detailed Description.

BRIEF DESCRIPTION OF THE DRAWINGS

A detailed description of the invention is hereafter described with specific reference being made to the drawings in which.

For the purposes of this disclosure, like reference numerals in the figures shall refer to like features unless otherwise indicated. The drawings are only an exemplification of the principles of the invention and are not intended to limit the invention to the particular embodiments illustrated.

DETAILED DESCRIPTION OF THE INVENTION

The methodologies and control strategies of the present disclosure are directed to the coating on the creping cylinder surface. Various types of chemistries make up the coating on the creping cylinder surface. These chemistries impart properties to the coating that function to improve the tissue making process. These chemistries will be collectively referred to as Performance Enhancing Materials (PEM/PEMs). An exemplary description of these chemicals and a method to control their application are discussed in U.S. Pat. No. 7,048,826 and U.S. Patent Publication No. 2007/0208115, which are herein incorporated by reference. In one embodiment, one of said plurality of apparatuses utilized is an eddy current sensor. The differential method can involve an eddy current and an optical displacement sensor. In one embodiment, the differential method comprises the steps of: applying the eddy current sensor to measure the distance from the sensor to a surface of the creping cylinder and applying an optical displacement sensor to measure the distance from the coating surface to the sensor. In a further embodiment, the optical displacement sensor is a laser triangulation sensor or a chromatic type confocal sensor.

Figure 1:
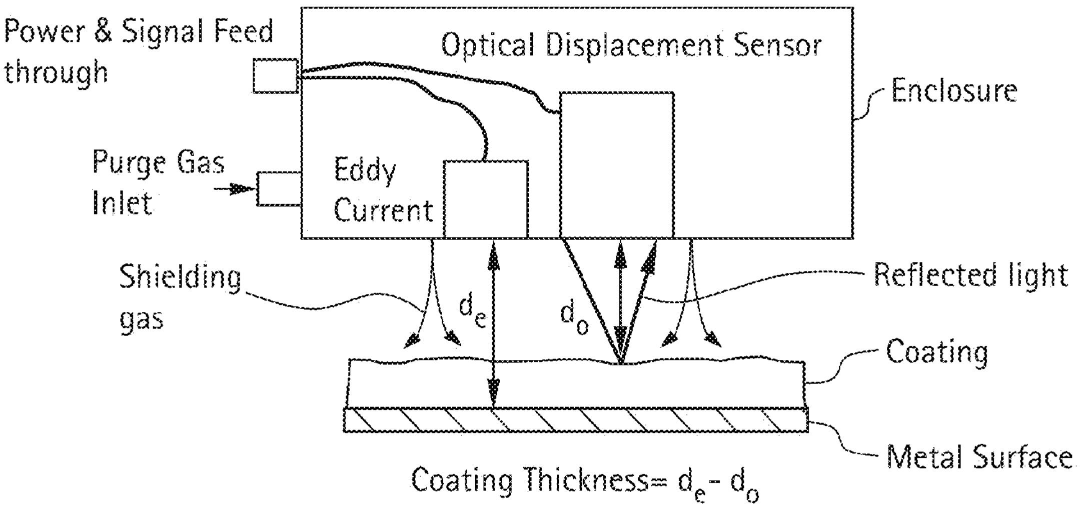
FIG. 1 is a schematic showing a combination of an eddy current and optical displacement sensor mounted in a common module.

FIG. 1 depicts an illustration of the sensor combination consisting of an eddy current sensor and an optical displacement sensor. The eddy current (EC) sensor operates on the principle of measuring the electrical impedance change. The EC produces a magnetic field by applying an alternating current (AC) to a coil. When the EC is in close proximity to a conductive target, electric currents are produced in the target. These currents are in the opposite direction of those in the coil, called eddy currents. These currents generate their own magnetic field that affects the overall impedance of the sensor coil. The output voltage of the EC changes as the gap ($d_e$) between the EC sensor and target changes, thereby providing a correlation between distance and voltage. In this application the EC sensor establishes a reference between the sensor enclosure and the creping cylinder surface.

The second sensor mounted in the enclosure optically measures the displacement of the sensor ($d_o$) with respect to the film surface. The optical displacement sensor can be either a triangulation type such as Micro-Epsilon (Raleigh, N.C.) model 1700-2 or a chromatic type such as Micro-Epsilons optoNCDT 2401 confocal sensor. These sensors work on the principle of reflecting light from the film surface. When variations in the coating optical properties exist due to process operating conditions, sensor monitoring location, or properties of the PEM itself, then a high performance triangulation sensor such as Keyence LKG-15 (Keyence—located Woodcliff Lake, N.J.) may be warranted. The Keyence triangulation sensor provides a higher accuracy measurement with built in algorithms for measuring transparent and translucent films. Variation in the transmission characteristics in both the cross direction (CD) and machine direction (MD) may warrant a sensor adaptable to the different coating optical characteristics and the higher performance triangulation sensor can switch between different measurement modes. In general, the majority of commercial triangulation sensors will produce a measurement error on materials that are transparent or translucent. If the film characteristics are constant, angling the triangulation sensor can reduce this error. However, sensor rotation for measurements on processes that have a high variability in the film characteristics is not an option. Both the optical and EC sensors provide the required resolution to monitor PEM films with expected thickness >50 microns. The film thickness is obtained by taking the difference between the measured distances from the EC and optical displacement sensor.

The sensors are housed in a purged enclosure, as shown in FIG. 1. Purge gas (clean air or N2) is used for sensor cooling, cleaning, and maintaining a dust free optical path. Cooling is required since the enclosure is positioned between 10-35 mm from the steam-heated creping cylinder. Additional cooling can be used, if needed, by using a vortex or Peltier cooler. Purge gas exiting the enclosure forms a shielding gas around the measurement zone to minimize particulate matter and moisture. Particulate matter can impact the optical measurement by attenuating both the launched and reflected light intensity. Whereas moisture condensing on the light entrance and exit windows of the enclosure will cause attenuation and scattering. The EC sensor is immune to the presence of particulate matter and moisture.

Figure 2:
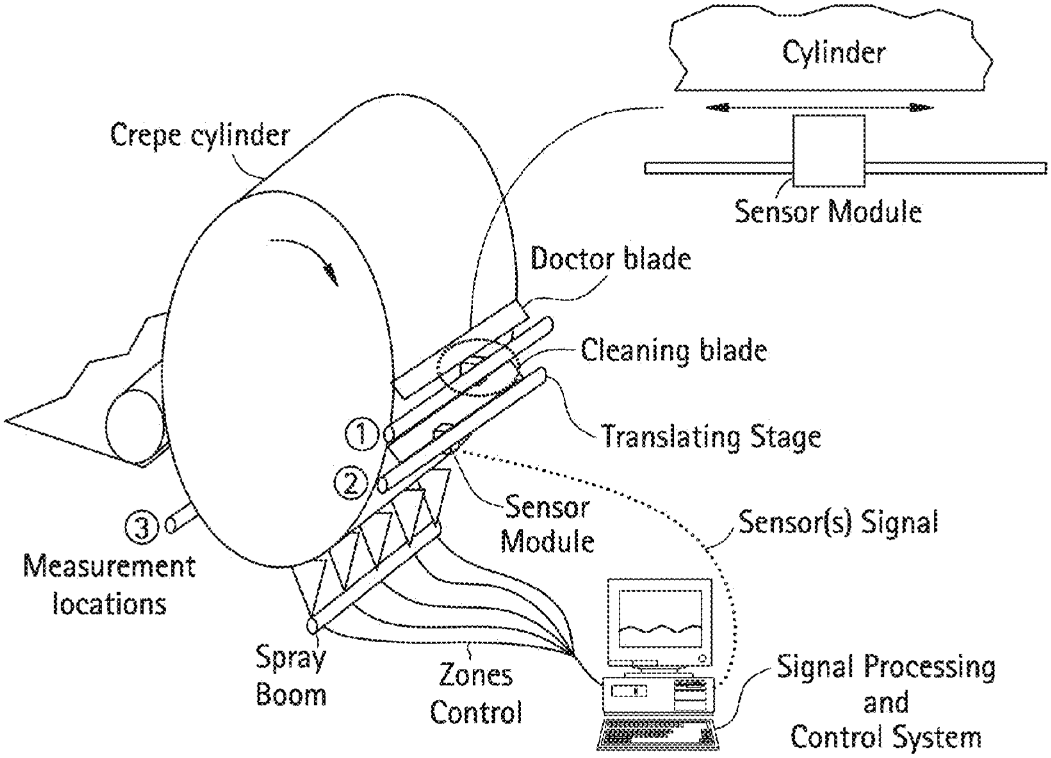
FIG. 2 is a schematic of a sensor module mounted on a translation stage for cross direction monitoring of the Yankee dryer coating.

For industrial monitoring on a creping cylinder (also known as a Yankee Dryer), the sensor module shown in FIG. 1 would be mounted on a translation stage as illustrated in FIG. 2. Before installation, the positioning of the sensors must be calibrated on a flat substrate to obtain a zero measurement reading. This is necessary since the positioning of the EC and optical displacement sensor can be offset differently relative to the substrate surface. The calibration step is necessary to adjust the position of each sensor to insure a zero reading when no film is present. Installation of the sensor module on the industrial process involves mounting the module at a distance in the correct range for both sensors to operate. By translating the module in the CD as the cylinder rotates a profile of the film thickness and quality can be processed and displayed. The processed results are then used for feedback control to activate the appropriate zone(s) for addition of PEM, other chemicals, or vary application conditions, e.g., flow rate, momentum, or droplet size. In addition, if the film quality (thickness or uniformity) cannot be recovered, then an alarm can be activated to alert operators of a serious problem, e.g., cylinder warp, doctor blade damage or chatter, severe coating build-up, etc. Finally, three measurement locations are identified in FIG. 2. Measurements on the film thickness and quality can be made between the doctor and cleaning blade (1), after the cleaning blade (2), or before the web is pressed on to the cylinder (3). A single location or multiple locations can be monitored.

Figure 3:
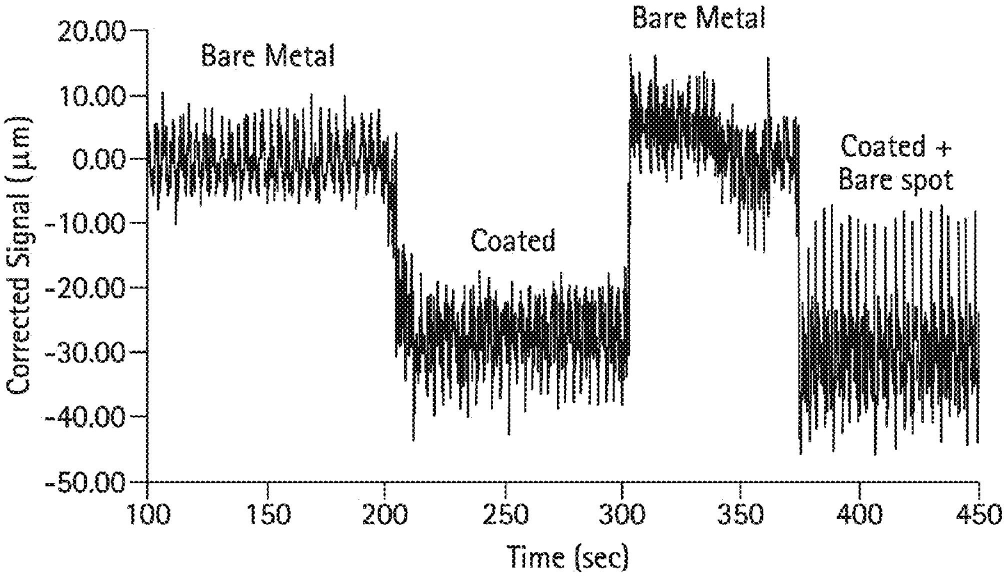
FIG. 3 is a dynamic data collection using an Eddy current plus triangulation sensor configuration.

Laboratory results using the combination of EC and optical displacement (triangulation) sensor are shown in FIG. 3. In this case dynamic measurements are made on a 95 mm diameter cast iron cylinder rotating at ~16-20 RPM (revolutions per minute). Half of the cylinder was coated with PEM. In the PEM coated portion of the cylinder a bare spot (~20 mm dia.) was made to simulate a defect region. FIG. 3 shows the corrected signal (Eddy-Triangulation) starting in the bare metal region. Translating the sensor combination to the coated region shows an average offset of ~27 microns due to the coating. Here the signal is negative, which represents a decrease in distance of 27 microns between the sensor and cylinder due to thickness of the coating. At 300 seconds the sensor combination was translated back to the bare metal area. Initially the signal appears higher, (~5 microns) requiring further adjustment to position the sensors closer to the original measurement location. This anomaly is likely an artifact of the laboratory system because of the sensors not measuring the exact same area and the small radius of curvature with the small-scale setup. Industrial monitoring on 14-18 ft diameter cylinders should minimize these effects, since the sensors would essentially view the cylinder as a flat plate. Finally, a demonstration to detect the coating defect was made by translating the sensors at ~375 seconds to the region containing the bare spot. Here the average coating thickness measured was ~30 microns. This is within 3 microns of the results from the region between 200-300 seconds. The appearance of a spike in the signal that approaches −10 microns identifies the presence of a coating defect. As the bare spot rotates through the measurement zone the signal approaches 0 microns. The 10 micron offset measured is attributed to residual coating in the defect area.

The results from FIG. 3 are summarized in Table 1 for corrected data as well as raw triangulation and EC data.

TABLE 1

Processed mean and standard deviation for different sensors and measurement locations. Corrected sensor is the film thickness measurement from the difference between the Eddy current and Triangulation.

| Sensor | Location | Mean (m) | STD |
|---|---|---|---|
| Corrected | Bare Metal | −0.33 | 3.41 |
| | Coating | −27.48 | 4.30 |
| | Coating + Spot | −30.97 | 6.47 |
| Triangulation | Bare Metal | 4.89 | 16.78 |
| | Coating | −49.86 | 15.82 |
| | Coating + Spot | −44.93 | 13.19 |
| Eddy Current | Bare Metal | −5.23 | 15.07 |
| | Coating | 22.37 | 13.38 |
| | Coating + Spot | 13.96 | 11.44 |

Figure 4:
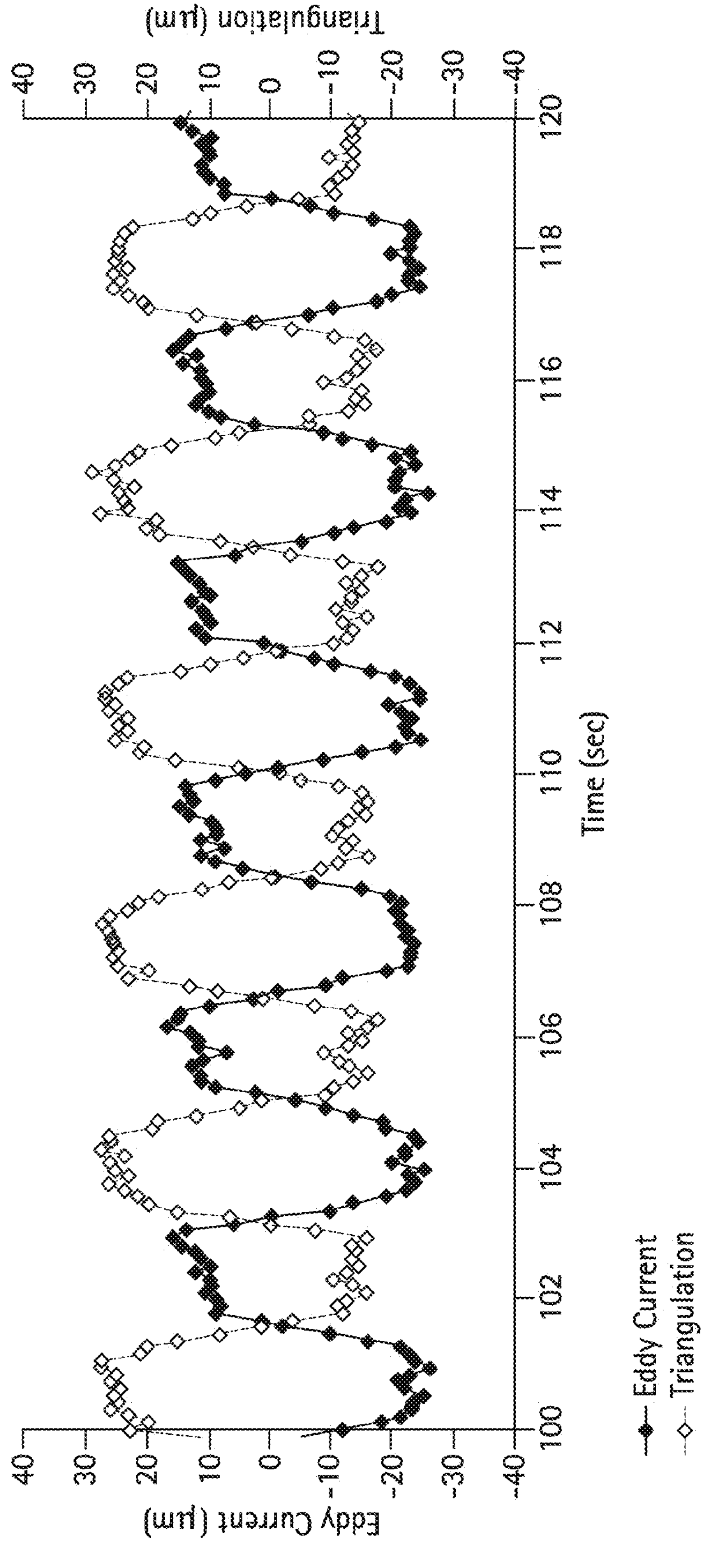
FIG. 4 is data regarding dynamic bare metal monitoring.
Figure 5:
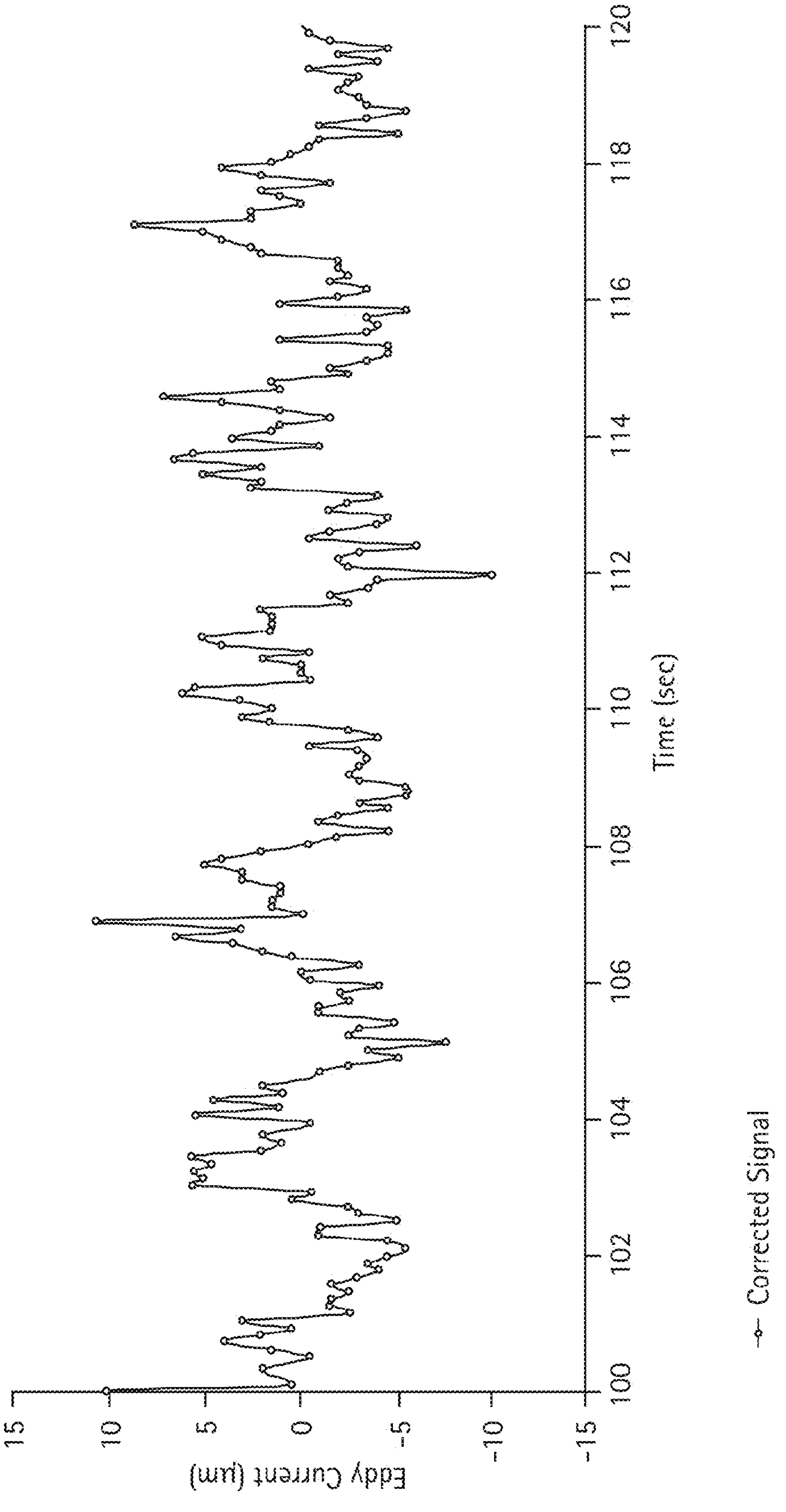
FIG. 5 is data regarding corrected dynamic bare metal monitoring.

Recorded measurements from the EC and triangulation sensor are shown in FIG. 4 for monitoring the bare metal region. The 40-50 micron oscillations observed in the measurement reflect the wobble in the cylinder rotation. By applying the correction (EC-Triangulation) the wobble is reduced to ~10 microns, as shown in FIG. 5. For industrial monitoring this variation will likely be reduced as the spatial location of the EC sensor approaches the optical displacement measurement spot and reduces the curvature effects.

Figure 6:
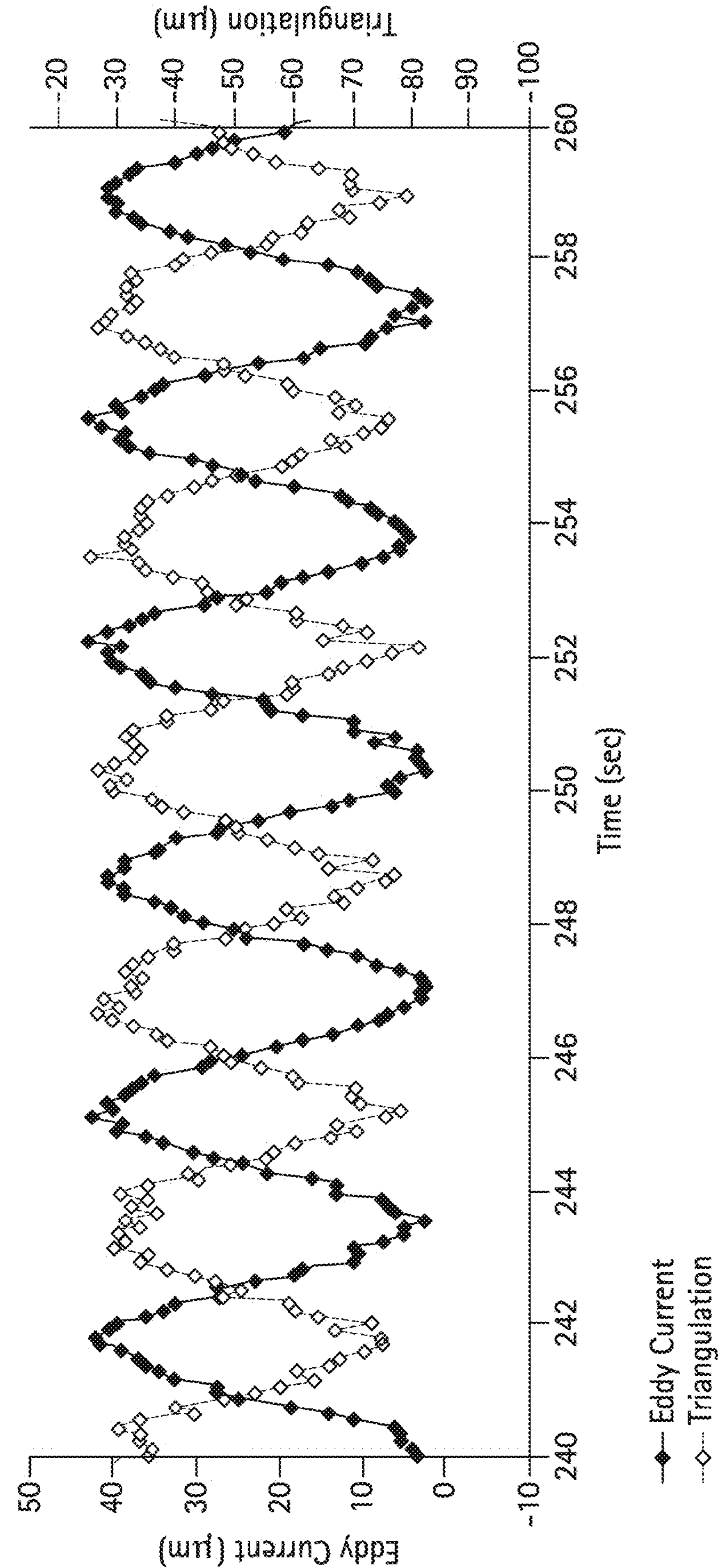
FIG. 6 is data regarding dynamic displacement monitoring in the coated region.
Figure 7:
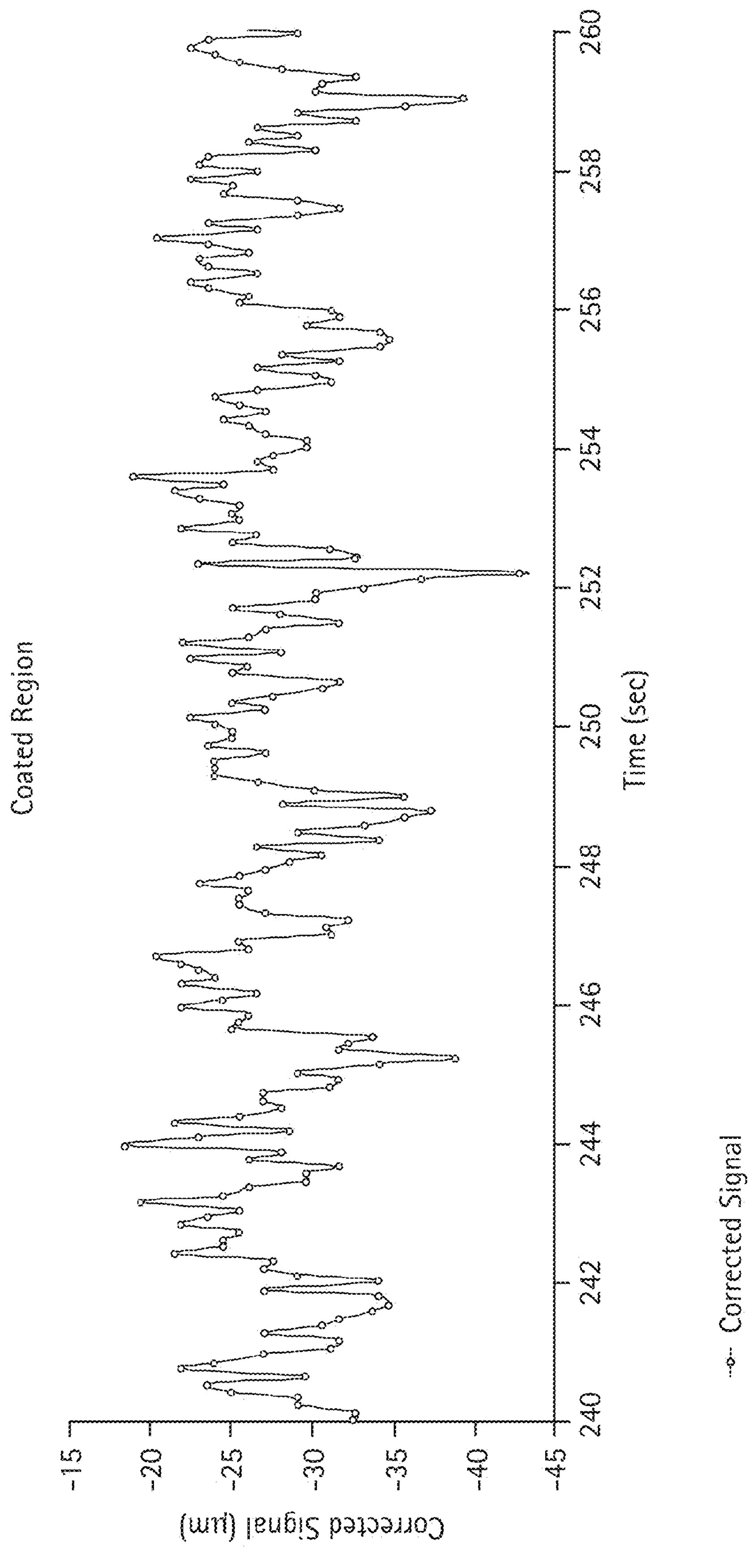
FIG. 7 is data regarding dynamic film thickness monitoring in the coated region.

Similarly FIG. 6 and FIG. 7 show results for monitoring the coated region. In this case, the corrected data shown in FIG. 7 has a variation between 15-20 microns. This larger variation in the data is likely due to surface non-homogeneities of the film. Both frequency and amplitude analysis of the signal can provide information on the quality of the coating. The measurement spot size of the triangulation sensor is ~30 microns. Therefore, the triangulation sensor easily resolves non-uniformities in the surface.

Figure 8:
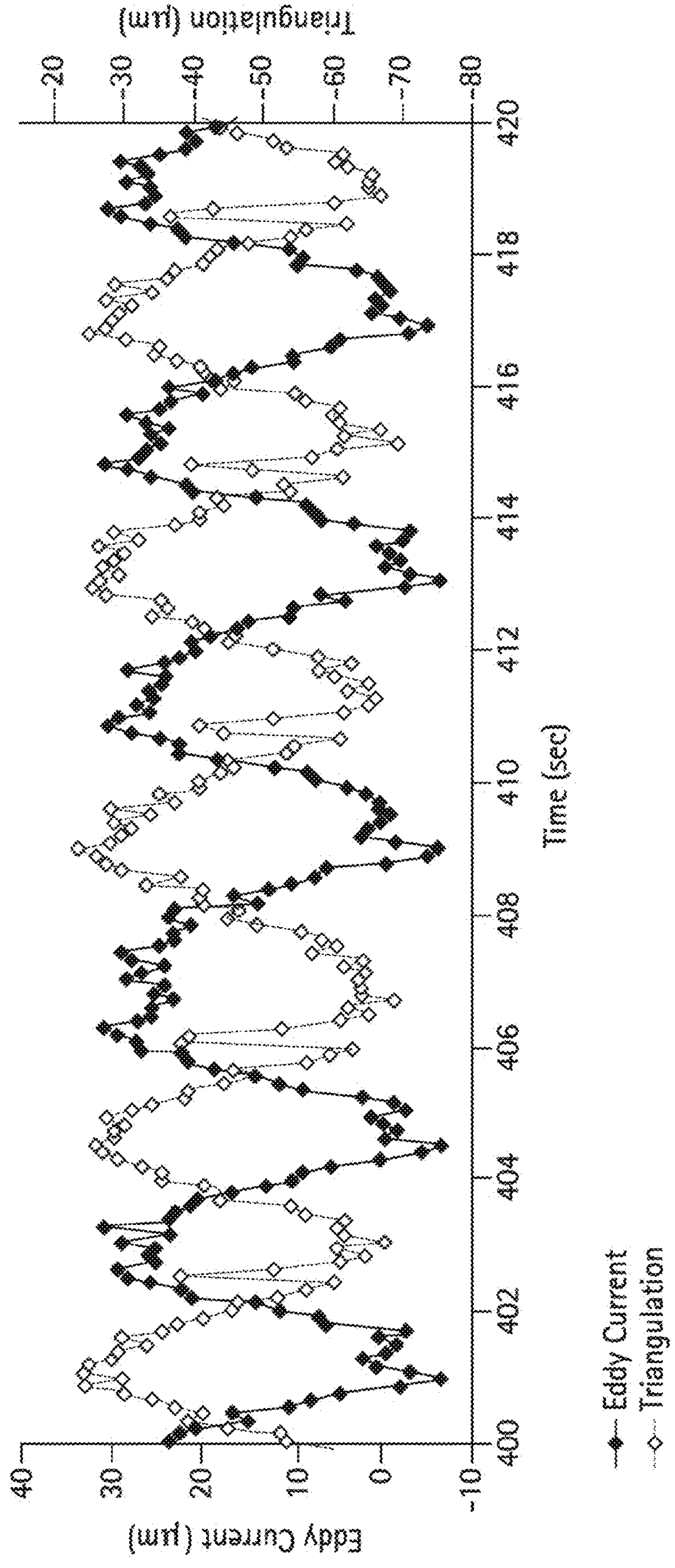
FIG. 8 is data regarding dynamic displacement monitoring in the coated region that contains a defect in the coating (bare spot).
Figure 9:
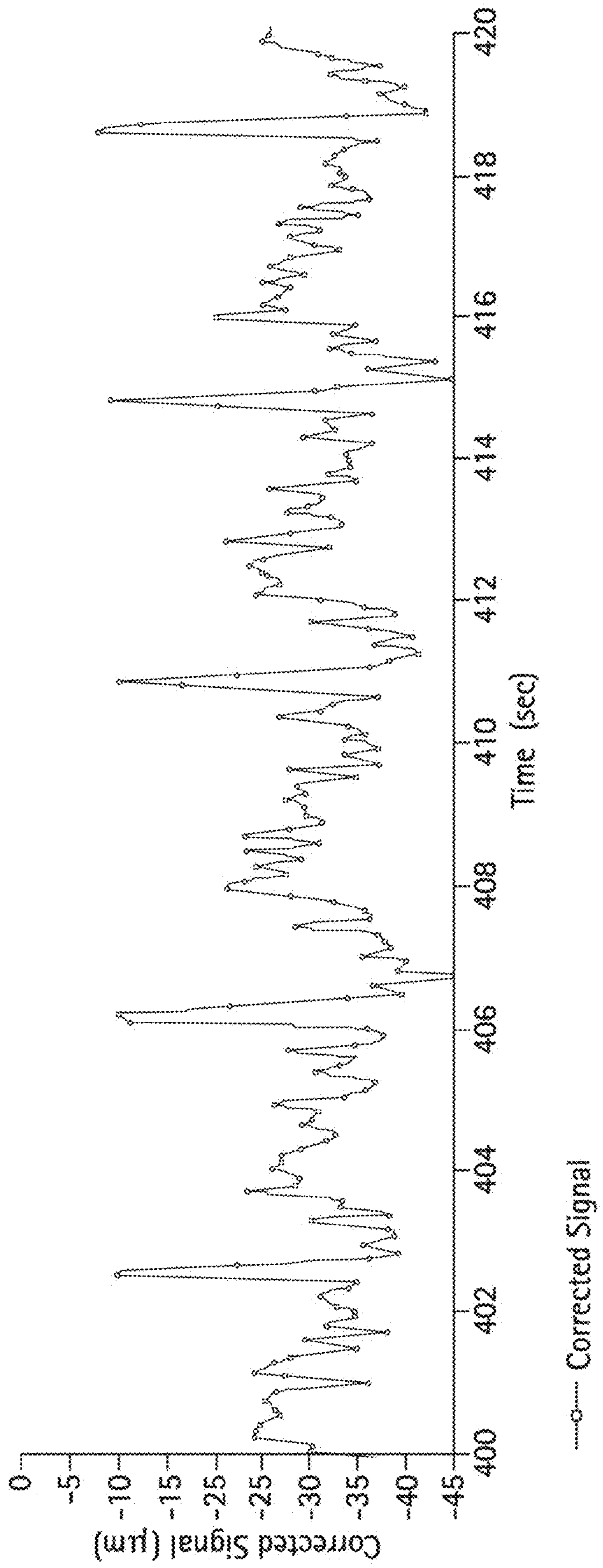
FIG. 9 is data regarding dynamic film thickness monitoring in the coated section that contains a defect in the coating (bare spot). The sharp spike that approach −10 μm identifies the presence of a defect in the coating.

Monitoring results from the coated region with the defect are shown in FIG. 8 and FIG. 9. The eddy current signal in FIG. 8 does not show evidence of the defect. Whereas the triangulation measurement indicates the presence of a defect by the sharp narrow spike. In the corrected signal shown in FIG. 9 the sharp spike from the coating defect is easily resolved.

Figure 12:
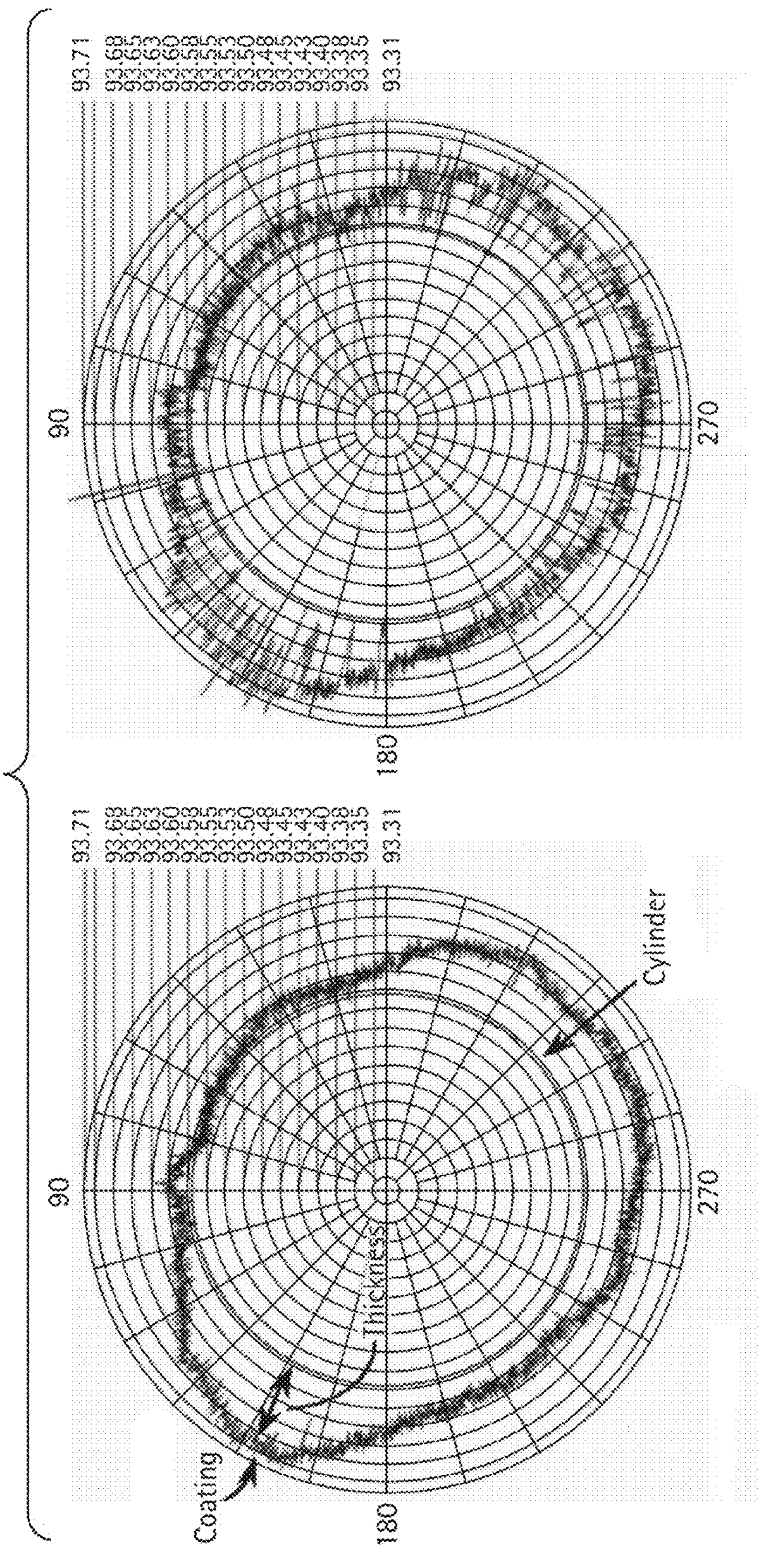
FIG. 12 is data regarding dynamic film thickness profile around a selected circumference zone. LHS (left handed side) shows non-uniformity in coating thickness. RHS (right handed side) shows the same coating with chatter marks from interaction with a doctor blade.

Another example showing the detection of uniformities is shown in FIG. 12. In this case, synchronous data collection was performed with a coated cylinder rotating at 59 RPM. The LHS figure shows a profile of the coating relative to the cylinder surface. The non-uniformity in the coating thickness is evident, but the surface is relatively smooth. The RHS figure shows the same coating subjected to chattering conditions through the interaction of a doctor blade and coating. Comparing the two cases clearly shows the sensor system's ability to capture degradation in the surface quality of the coating. Detecting chattering events is critical on the Yankee process to perform corrective maintenance that minimizes the impact on product quality and asset protection.

Moisture, which may affect the differential calculation, can also be accounted for; specifically moisture can be calculated from the dielectric constant derived from a capacitance measurement. This data can be utilized to decide whether any change in thickness is a result of moisture or the lack of a coating. Another way of looking at the capacitance is that it is a safeguard for a measurement obtained by the described differential method; it provides a more in-depth analysis of the coating itself, e.g. behaviors of the coating such as glass transition temperature and modulus, which is useful in monitoring and controlling the coating on the creping cylinder surface.

One method of accounting for moisture content in the coating is by looking at capacitance and another way is to utilize a moisture sensor. Other techniques may be utilized by one of ordinary skill in the art.

In one embodiment, the method incorporates a dedicated moisture sensor such as the one described in WO2006118619 based on optical absorption of $H_2O$ in the 1300 nm region, wherein said reference is herein incorporated by reference. This will give a direct measurement of the moisture level in the film without interferences that the capacitance monitor could experience due its dependence on the dielectic constant of both the coating and moisture. In another embodiment, the method additionally comprises: applying a capacitance probe to measure the moisture content of the coating; comparing the capacitance measurement with the differential method measurement to determine the effect of moisture on the coating thickness; and optionally adjusting the amount and distribution of the coating on the creping cylinder surface in response to the effect moisture has on thickness as determined by the differential method and/or adjust the amount of the coating.

Figure 10:
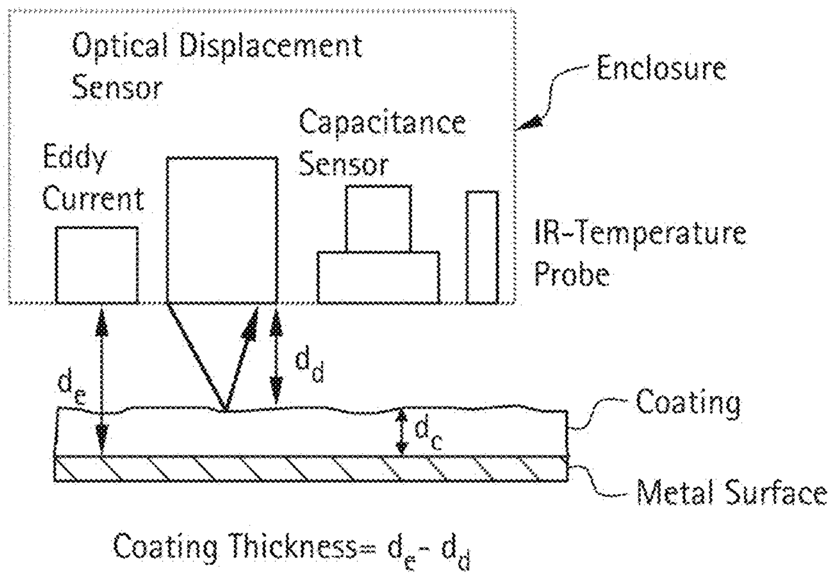
FIG. 10 is a schematic showing the combination of Eddy current, optical displacement, capacitance, and IR temperature mounted in a common module.

The method can use a module that houses multiple sensors as shown in FIG. 10. The module is similar to the one presented in FIG. 1, but with additional sensor elements. The module in FIG. 10 includes a capacitance probe and an optical infrared temperature probe. Capacitance probes such as Lion Precision, St. Paul, Minn. are widely used in high-resolution measurements of position or change of position of a conductive target. Common applications in position sensing are in robotics and assembly of precision parts, dynamic motion analysis of rotating parts and tools, vibration measurements, thickness measurements, and in assembly testing where the presence or absence of metallic parts are detected. Capacitance can also be used to measure certain characteristics of nonconductive materials such as coatings, films, and liquids.

Capacitance sensors utilize the electrical property of capacitance that exists between any two conductors that are in close proximity of each other. If a voltage is applied to two conductors that are separated from each other, an electric field will form between them due to the difference between the electric charges stored on the conductor surfaces. Capacitance of the space between them will affect the field such that a higher capacitance will hold more charge and a lower capacitance will hold less charge. The greater the capacitance, the more current it takes to change the voltage on the conductors.

The metal sensing surface of a capacitance sensor serves as one of the conductors. The target (Yankee drum surface) is the other conductor. The driving electronics induces a continually changing voltage into the probe, for example a 10 kHz square wave, and the resulting current required is measured. This current measurement is related to the distance between the probe and target if the capacitance between them is constant.

The following relationship applies:

$$C = \frac{\varepsilon A}{d} \tag{1}$$

where C is the capacitance (F, farad), ∈ is the dielectric property of the material in the gap between the conductors, A is the probe sensing area, and d is the gap distance. The dielectric property is proportional to the material's dielectric constant as ∈=∈r∈0, where ∈r is the dielectric constant and ∈0 is the vacuum permittivity constant. For air, ∈r=1.006 and for water, ∈r=78. Depending on which two parameters are being held constant, the third can be determined from the sensor's output. In the case of position, d is measured where air is usually the medium. For our application in Yankee systems, the variability of ∈r in the total gap volume is the measured parameter. In this case, the gap is composed of three main components air, film or coating that could also contain fibrous material, and moisture. A mixture dielectric constant can be expressed as:

$$\in_r = \in_f^{\Phi_f} \in_w^{\Phi_w} \in_a^{\Phi_a} \tag{2}$$

where ϕ is the volume fraction with the subscript and superscript referencing the component material (a=air, w=water, f=film). Using Eq 1 and 2 the change in capacitance due to the presence of moisture is given by:

$$C_{fw} - C_f = \frac{\varepsilon_0 \varepsilon_f^{\Phi_f} \varepsilon_w^{\Phi_w} \varepsilon_a^{\Phi_a} A}{d} - \frac{\varepsilon_0 \varepsilon_f^{\Phi_f} \varepsilon_w^{\Phi_w} \varepsilon_a^{\Phi_a} A}{d} \tag{3}$$

where $C_{fw}$ is the capacitance for film containing moisture and $C_f$ is the dry film. Taking the log and rearranging Eq. 3 an expression for the volume fraction on moisture is given by:

$$\Phi_w = \frac{\log\left(\frac{C_{fw}}{C_f}\right)}{\log(\varepsilon_w)} \tag{4}$$

For monitoring the Yankee film, the mixture capacitance $C_{fw}$ is measured directly with the capacitance probe. The temperature dependent dielectric constant for water is obtained from literature values. The volume fraction of moisture is then obtained by knowing the dry film capacitance, which can be determined from the film thickness measurement ($d_c$) using the optical sensor and knowing the dielectric constant of the film.

The average dielectric constant for the gap volume is proportionally composed of that for air and the coating. The more coating in the gap, the larger the average dielectric constant is. By controlling d and A, any sensitivity and range can be obtained.

Because capacitance is sensitive to the moisture content of the coating, it may be difficult to separate out variation in coating thickness from changes in moisture content. By incorporating the set of sensors (EC, optical displacement, and capacitance) in the module shown in FIG. 10, this information provides a means of cross checking the film thickness and information on the moisture content of the coating. The EC sensor provides a baseline reference distance for real-time correction used in both the optical displacement ($d_d$) and capacitance. The capacitance averages over a much larger area compared to the optical probe. For example, a capacitance probe using a gap distance of 0.005 m would use a 19 mm diameter sensing probe head. The measurement area would be 30% larger than the probe head. Whereas optical displacement probes measure an area of 20 microns to 850 microns depending on the probe used. The higher resolution measurement from the optical probes will show sensitivity to smaller variation on the coating surface. However, the average measurement from the optical probe over a larger area will give similar results as the capacitance. Differences between the capacitance and optical probe reading can then be attributed to moisture content in the film provided the dielectric constant of the coating is known.

An infrared (IR) temperature probe such as OMEGA (Stamford, Conn.) model O536-3-T-240F can provide useful information on the temperature profile of the creping cylinder. Since PEM's will respond differently depending on temperature, temperature information can be used to adjust the chemical composition and level of PEMs applied to the cylinder.

In one embodiment, the method further comprises: (a) applying an IR temperature probe to measure the temperature profile of the creping cylinder; (b) applying an IR temperature probe to measure the coating temperature needed to correct for the temperature dependent moisture dielectric constant; and (c) applying the corrected moisture dielectric constant to the capacitance measurement to determine the correct coating moisture concentration.

The addition of the IR temperature probe in the sensor module provides information on the temperature profile of the crepe cylinder. This is useful in identifying temperature non-uniformities on the crepe cylinder. In addition, the temperature can be used to correct the dielectric constant of the coating. For example, the dielectric constant for water can vary from 80.1 (20° C.) to 55.3 (100° C.).

An ultrasonic sensor may be incorporated into the monitoring methodology. In one embodiment, the method further comprises applying an ultrasonic sensor to measure the modulus of the coating, and optionally wherein the modulus value is used to measure the hardness of the coating.

The ultrasonic sensor is used to detect the viscoelastic property of the coating. The propagation of sound wave (reflection and attenuation) through the film will depend on the film quality, e.g., hard versus soft. Information on the film properties can be used for feedback to a spray system for controlling the spray level or adjusting the spray chemistry, e.g., dilution level, to optimize the viscoelastic film property.

As stated above, an interferometer may be utilized in measuring thickness. Other analytical techniques, such as the ones described in this disclosure can be utilized in conjunction with an interferometry method. In addition, the differential method can be used in conjunction with a methodology that utilizes an interferometer to measure thickness of the coating.

Figure 11:
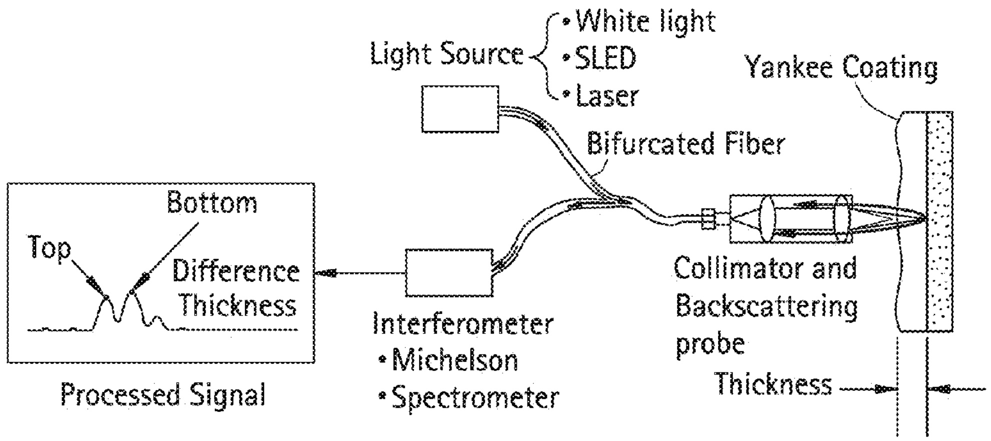
FIG. 11 is a schematic illustrating the general use of interferometry for coating thickness monitoring on the crepe cylinder. All inferometer measurements are based on constructive and destructive interference of waves. Film thickness is determined from fringe pattern. The advantages are: probe head adaptable for harsh environments, sensitive electronics located far from measurement point, dynamic monitoring, (sampling rates up to 200 Hz) large dynamic range (100 nm-12 mm), and multiplexing.

In one embodiment, the method uses interferometry to monitor the coating thickness. If the coating has sufficient transmission, then the use of multiple sensors can be reduced to a single probe head as illustrated in FIG. 11. In this case, light is transported to the probe by fiber optic cable. Reflected light from both surfaces of the film is collected back into the fiber probe for processing to extract coating thickness information. Several different techniques can be used for processing the collected light. Industrial instruments such as Scalar Technologies Ltd. (Livingston, West Lothian, UK) uses a spectral interferometry technique based on measuring the wavelength dependent fringe pattern. The number of fringes is dependent on the film thickness. Alternatively, Lumetrics Inc. (West Henrietta, N.Y.) instrument based on a modified Michelson interferometer determines thickness based on the difference in measured peaks resulting from each surface. Monitoring the coating on the crepe cylinder with an interferometry probe can be made at any of the locations illustrated in FIG. 2. The main requirement is that the film has sufficient transmission for the light to reflect off the internal surface, i.e., near the substrate. One unique feature of the interferometry measurement is the ability to measure coating layers. This capability can be utilized at monitoring location 3 shown in FIG. 2. At this location the coating is not fully dry and is free from process disturbances such as from the pressure roll that applies the tissue sheet to the creping cylinder, direct contact with the web, doctor blade, and cleaning blade. An interferometry sensor at this location provides the thickness of the freshly applied coating. This aids in knowing the spatial distribution of the coating prior to any disturbances. For example, knowing the coating thickness before and after process disturbances can identify inefficiencies in the spray system, areas experiencing excessive wear, or other dynamic changes.

As stated above, the methodologies of the present disclosure provide for optionally adjusting the application rate of said coating in one or more defined zones of said creping cylinder to provide a uniformly thick coating in response to the thickness of said coating. Various types of apparatuses can carry out this task.

In one embodiment, the method controls the spray zones based on measurements collected during normal operating conditions. For example, measurements from the sensor or sensor(s) discussed above are used to establish a baseline profile on the crepe cylinder. The baseline data is then used to track process variances. Upper and lower control limits established around the baseline profile data (film thickness, film quality, moisture level, viscoelasticity, temperature, etc.) is used to track when process deviations occur. If any of the process monitoring parameters falls outside the limits, then corrective action is taken with the zone control spray application system.

In another embodiment, the plurality of apparatuses are translated across the Yankee dryer/creping cylinder to provide profiles of thickness and/or moisture content and/or temperature, and/or modulus.

In another embodiment, the plurality of apparatuses are located between a crepe blade and a cleaning blade, after the cleaning blade, or prior to a tissue web being pressed into the coating, or any combination of the above.

In another embodiment, the plurality of apparatuses are purged with a clean gas to prevent fouling, mist interference, dust interference, overheating, or a combination thereof.

As described in U.S. Pat. No. 5,328,565 (which is incorporated by reference in its entirety) it is thought by some that chatter might also be caused at least in part by properties of the tissue web which are unrelated to the coating itself. In at least one embodiment the tissue web is measured (before, while and/or after it is contacted with the coating) by any method (including non-contact method) to determine if the tissue web itself will cause chatter. In at least one embodiment this is accomplished by comparing one or more of the measurements of the coating separate from the tissue web, and/or when the two are combined together. As a single representative example of this general concept, in at least one embodiment a capacitance measurement is taken of the tissue web alone, the coating alone, and the contacted coating-tissue web, to determine if it is the coating, the tissue web, or both that are a cause of chatter. In at least one embodiment both the coating and the tissue web contain peaks but only the coating's peaks would cause chatter. In at least one embodiment when the source of the chatter (or would be chatter) is identified only that source is adjusted to prevent the chatter.

While this invention may be embodied in many different forms, there are described in detail herein specific preferred embodiments of the invention. The present disclosure is an exemplification of the principles of the invention and is not intended to limit the invention to the particular embodiments illustrated. All patents, patent applications, scientific papers, and any other referenced materials mentioned herein are incorporated by reference in their entirety. Furthermore, the invention encompasses any possible combination of some or all of the various embodiments mentioned herein, described herein and/or incorporated herein. In addition the invention encompasses any possible combination that also specifically excludes any one or some of the various embodiments mentioned herein, described herein and/or incorporated herein.

The above disclosure is intended to be illustrative and not exhaustive. This description will suggest many variations and alternatives to one of ordinary skill in this art. All these alternatives and variations are intended to be included within the scope of the claims where the term "comprising" means "including, but not limited to". Those familiar with the art may recognize other equivalents to the specific embodiments described herein which equivalents are also intended to be encompassed by the claims.

All ranges and parameters disclosed herein are understood to encompass any and all subranges subsumed therein, and every number between the endpoints. For example, a stated range of "1 to 10" should be considered to include any and all subranges between (and inclusive of) the minimum value of 1 and the maximum value of 10; that is, all subranges beginning with a minimum value of 1 or more, (e.g. 1 to 6.1), and ending with a maximum value of 10 or less, (e.g. 2.3 to 9.4, 3 to 8, 4 to 7), and finally to each number 1, 2, 3, 4, 5, 6, 7, 8, 9, and 10 contained within the range. All percentages, ratios and proportions herein are by weight unless otherwise specified.

This completes the description of the preferred and alternate embodiments of the invention. Those skilled in the art may recognize other equivalents to the specific embodiment described herein which equivalents are intended to be encompassed by the claims attached hereto.

The invention claimed is:

1. A method of monitoring and optionally controlling the application of a coating containing a Performance Enhancing Material (PEM) on a surface of a creping cylinder comprising:

(a) applying a coating to the surface of the creping cylinder;

(b) determining if a thickness of the coating is sufficiently non-uniform so as to exceed a threshold known to cause blade chatter by measuring the thickness of the coating on the surface of the creping cylinder by a differential method, wherein said differential method utilizes a plurality of apparatuses that do not physically contact the coating, wherein the plurality of apparatuses includes at least one apparatus selected from the group consisting of an IR-temperature sensor, a spectrometer, an inferometer, an ultrasonic sensor, a moisture measuring device, and a modulus measuring device;

(c) adjusting the application of said coating in one or more defined zones of said creping cylinder in response to the thickness of said coating so as to provide a uniform thick coating on the surface of the creping cylinder; and (d) applying an additional device(s) to monitor and optionally control other aspects of the coating on the creping cylinder aside from the thickness of the coating.

2. The method of claim 1 wherein the plurality of apparatuses includes at least one additional apparatus selected from the list consisting of: eddy current sensor, optical displacement sensor, capacitance sensor, thickness measuring device, and any combination thereof.

3. The method of claim 1, further comprising:

applying a capacitance probe to measure the moisture content of the coating to determine a capacitance measurement;

comparing the capacitance measurement with the differential method measurement to determine the effect of moisture on the coating thickness; and optionally adjusting the amount and distribution of the coating on the creping cylinder surface in response to the effect moisture has on thickness as determined by the differential method.

4. A method of monitoring and optionally controlling the application of a coating containing a Performance Enhancing Material (PEM) on a surface of a creping cylinder wherein the cylinder rotates in a machine direction and a crepe blade is engaged to the cylinder, the method comprising:

(a) applying a coating to the surface of the creping cylinder;

(b) measuring the coating using a non-contact measurement;

(c) determining if a thickness of the coating is sufficiently non-uniform so as to exceed a threshold known to cause blade chatter by measuring the thickness of the coating on the surface of the creping cylinder by a differential method; and (d) adjusting the application of said coating in one or more defined zones of said creping cylinder in response to the thickness of said coating.

5. The method of claim 4, wherein the differential method is a non-contact measurement on the applied coating.

6. The method of claim 4 wherein the non-contact measurement is carried out using a member selected from the list consisting of an eddy current sensor, an optical displacement sensor, a capacitance sensor, an IR-temperature sensor, a spectrometer, an inferometer, a triangulation device, an ultrasonic sensor, a moisture measuring device, a thickness measuring device, a modulus measuring device, a laser triangulation sensor, a chromatic type confocal sensor, and any combination thereof.

7. The method of claim 4, wherein the tissue web and the coating are adjusted to prevent chatter.

* * * * *